(12) United States Patent
Nakayama (10) Patent No.: US 8,727,585 B2
(45) Date of Patent: May 20, 2014

(54) SUPPORT FOR MOUNTING LIGHT-EMITTING ELEMENT, AND LIGHT-EMITTING DEVICE

(75) Inventor: Katsuyoshi Nakayama, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 17 days.

(21) Appl. No.: 13/562,723

(22) Filed: Jul. 31, 2012

(65) Prior Publication Data

US 2012/0294019 A1    Nov. 22, 2012

Related U.S. Application Data

(63) Continuation of application No. PCT/JP2010/071297, filed on Nov. 29, 2010.

(30) Foreign Application Priority Data

Feb. 1, 2010    (JP) .................................. 2010-020240

(51) Int. Cl.
*F21V 21/00* (2006.01)

(52) U.S. Cl.
USPC ........................ 362/382; 362/249.02; 362/458

(58) Field of Classification Search
USPC .......................... 362/249.02, 382, 458; 257/98
See application file for complete search history.

(56) References Cited

U.S. PATENT DOCUMENTS

| 6,548,895 | B1 * | 4/2003 | Benavides et al. | 257/712 |
| 6,874,910 | B2 * | 4/2005 | Sugimoto et al. | 362/294 |
| 8,174,043 | B2 | 5/2012 | Ito | |
| 2007/0253209 | A1 * | 11/2007 | Loh et al. | 362/458 |
| 2011/0211348 | A1 * | 9/2011 | Kim | 362/235 |
| 2012/0243223 | A1 * | 9/2012 | You | 362/235 |

FOREIGN PATENT DOCUMENTS

| JP | 07-326835 | 12/1995 |
| JP | 2004-259898 | 9/2004 |
| JP | 2006-278761 | 10/2006 |
| JP | 2007-207464 | 8/2007 |
| JP | 2008-041699 | 2/2008 |
| JP | 2008-153553 | 7/2008 |

(Continued)

OTHER PUBLICATIONS

U.S. Appl. No. 13/567,648, filed Aug. 6, 2012, Okada, et al.

(Continued)

*Primary Examiner* — Stephen F Husar
*Assistant Examiner* — James Cranson, Jr.
(74) *Attorney, Agent, or Firm* — Oblon, Spivak, McClelland, Maier & Neustadt, L.L.P.

(57) ABSTRACT

A supporting body for mounting a light emitting element having excellent heat dissipation performance to suppress damage to the base or decrease of air tightness caused by heat even in cases where a high-power light emitting element is mounted thereon. The supporting body for mounting a light emitting element is obtained by integrally molding an insulating base that has a mounting part on which a light emitting element is mounted and a lead frame for packaging a light emitting element that is mounted on the insulating base. The supporting body for mounting a light emitting element is characterized in that the insulating base is composed of a sintered body of a glass ceramic composition that contains a low melting point glass powder and a ceramic filler and the low melting point glass powder has a softening point of not more than 630° C.

8 Claims, 3 Drawing Sheets

(56) References Cited

FOREIGN PATENT DOCUMENTS

| | | |
|---|---|---|
| JP | 2009-081430 | 4/2009 |
| JP | 2009-135543 | 6/2009 |
| JP | 2010-003941 | 1/2010 |

OTHER PUBLICATIONS

U.S. Appl. No. 13/592,762, filed Aug. 23, 2012, Nakayama, et al.
International Search Report issued Dec. 28, 2010 in PCT/JP2010/071297 filed Nov. 29, 2010.

* cited by examiner

SUPPORT FOR MOUNTING LIGHT-EMITTING ELEMENT, AND LIGHT-EMITTING DEVICE

This application is a continuation of PCT Application No. PCT/JP2010/071297 filed on Nov. 29, 2010, which is based upon and claims the benefit of priority from Japanese Patent Application No. 2010-020240 filed on Feb. 1, 2010. The contents of those applications are incorporated herein by reference in its entirety.

TECHNICAL FIELD

The present invention relates to a support for mounting a light-emitting element and a light-emitting device using it, particularly, a support for mounting a light-emitting element which has excellent reliability of an insulating base plate on which a light-emitting element is to be mounted, and a light-emitting device using it.

BACKGROUND ART

In recent years, along with a tendency to high brightness and whitening of a light-emitting diode element (chip), a light-emitting device employing a light-emitting diode element has been used for e.g. illumination or backlights for various displays or large-sized liquid crystal TVs. A support for mounting a light-emitting element on which a light-emitting diode element is to be mounted is usually required to have high reflection properties so that light emitted from the element is efficiently reflected. In addition, as the heat value is increased along with the tendency to high brightness of a light-emitting diode element in recent years and the temperature is excessively increased, a support from which heat generated from the light-emitting element is quickly dissipated and with which damages, etc. by heat can be suppressed and high reliability can be obtained, has been desired. Particularly in the case of a light-emitting device for e.g. illumination, it is necessary that a large quantity of heat generated from the light-emitting element is quickly dissipated to the outside.

As a support for mounting a light-emitting element to be used for such a light-emitting device, for example, a metal-resin package has been known (Patent Document 1).

A metal-resin package is one obtained by integrally forming a lead frame made of an electrically conductive metal such as aluminum, copper, an iron/copper alloy or an iron/nickel alloy and a filler-containing resin having a reflective filler dispersed in a resin. By mounting a light-emitting element on such a lead frame, heat generated from the light-emitting element is quickly dissipated. The filler-containing resin to be used for the metal-resin package has a great difference in the refractive index with the reflective filler and the resin, whereby a high reflectance can be obtained, and as its material cost is low, it has been widely used as a support for mounting a light-emitting element.

However, the metal-resin package is likely to be deteriorated by heat at its resin portion, and in a case where a high power light-emitting diode element (chip) is mounted, damage such as burning of the resin is likely to occur, thus leading to poor reliability as a light-emitting device. Particularly the resin portion of the metal-resin package is promptly damaged when irradiated with ultraviolet rays, and such a package is not applicable to a light-emitting device on which an ultraviolet LED is to be mounted as the light-emitting element.

PRIOR ART DOCUMENT

Patent Document

Patent Document 1: JP-A-2008-41699

DISCLOSURE OF INVENTION

Technical Problem

To solve such problems, the employment of a ceramic substrate such as an alumina substrate as the support for mounting a light-emitting element is increasing. However, as the firing temperature of the alumina substrate is from 1,500 to 1,600° C., when it is fired as integrated with an electrically conductive metal (lead frame) such as aluminum, copper, an iron/copper alloy or an iron/nickel alloy, most of the electrically conductive metals are likely to be oxidized or melted.

On the other hand, as an inorganic material other than such a ceramic, a glass material may be mentioned. In a case where a glass material is used as the support for mounting a light-emitting element, if one having a softening point (Ts) exceeding 655° C. is used, oxidation or melting of the electrically conductive metal (lead frame) is likely to occur. Accordingly, in a case where a glass material is used as the support for mounting a light-emitting element, it should be one having a softening point (Ts) of at most 655° C.

As a glass material having a softening point (Ts) of at most 655° C., for example, one containing bismuth as the main component has been known. However, one containing bismuth as the main component is usually colored, and transparent one will not be obtained. Accordingly, if such a glass material is employed as the support for mounting a light-emitting element, the reflectance to light having a desired wavelength tends to be lowered, and light from the light-emitting element is not efficiently extracted in some cases.

The present invention has been made to solve the above problems, and its object is to provide a support for mounting a light-emitting element, which has excellent heat dissipation properties, and of which damage of the base plate or the decrease in the hermetic by heat are suppressed even when a high power light-emitting element is mounted.

Further, another object of the present invention is to provide a light-emitting device using the above support for mounting a light-emitting element.

Solution to Problem

The present inventor has conducted extensive studies and found that the above problems can be solved by the support for mounting a light-emitting element and the light-emitting device of the present invention and accomplished the present invention.

That is, the support for mounting a light-emitting element of the present invention comprises an insulating base plate having a mounting portion on which a light-emitting element is to be mounted, and a lead frame for packaging the light-emitting element to be mounted on the insulating base plate, integrally formed, wherein the insulating base plate is made of a sintered product of a glass ceramic composition containing a low temperature melting glass powder and a ceramic filler, and the softening point (Ts) of the low temperature melting glass powder is at most 630° C.

The ceramic filler is preferably one member or a mixture of two or more selected from an alumina powder, a zirconia powder and a titania powder.

The lead frame is preferably made of an electrically conductive metal or alloy selected from aluminum, copper, an iron/copper alloy and an iron/nickel alloy.

It is preferred that in the glass ceramic composition, the content ratio of the low temperature melting glass powder is at least 60 vol % and at most 80 vol %, and the content ratio of the ceramic filler is preferably at least 20 vol % and at most 40 vol %.

It is preferred that the insulating base plate has a mounting portion on which a light-emitting element is to be mounted, which is concave in a bowl shape, and the lead frame penetrates through the insulating base plate and is exposed to the bottom of the mounting portion.

The softening point (Ts) of the low temperature melting glass powder is preferably at least 450° C. and at most 630° C.

The 50% particle size (D50) of the low temperature melting glass powder is preferably at least 0.5 μm and at most 4 μm.

Further, the light-emitting device of the present invention comprises the above support for mounting a light-emitting element of the present invention, and a light-emitting element mounted on the mounting portion of the above support for mounting a light-emitting element.

Advantageous Effects of Invention

According to the present invention, by using a predetermined glass ceramic composition as the insulating base plate on which a light-emitting element is to be mounted, a support for mounting a light-emitting element having high heat resistance and having damage of the base plate or the decrease in hermetic by heat suppressed, can be obtained. Further, as the support for mounting a light-emitting element of the present invention is excellent in the heat dissipation properties since the lead frame and the insulating base plate are integrally formed.

Further, according to the present invention, by employing such a support for mounting a light-emitting element, a light-emitting device of which the damage of the base plate or the decrease in hermetic by heat can be suppressed even when a high power light-emitting element is mounted, and from which heat generated from the light-emitting element can quickly be dissipated to the outside, can be obtained.

DESCRIPTION OF EMBODIMENTS

Now, the present invention will be described in detail below.

The support for mounting a light-emitting element of the present invention comprises an insulating base plate having a mounting portion on which a light-emitting element is to be mounted, and a lead frame for packaging the light-emitting element to be mounted on the insulating base plate, integrally formed, wherein the insulating base plate is made of a sintered product of a glass ceramic composition containing a low temperature melting glass powder and a ceramic filler, and the softening point (Ts) of the low temperature melting glass powder is at most 630° C.

According to the present invention, by constituting the insulating base plate on which a light-emitting element is to be mounted by the above glass ceramic composition containing, as the main components, a low temperature melting glass powder having a softening point (Ts) of at most 630° C. and a ceramic filler, heat resistance can be improved as compared with conventional technique. Accordingly, even when a high power light-emitting element is mounted, the base plate portion will not substantially damaged by heat.

Further, by employing the above glass ceramic composition as the insulating base plate on which a light-emitting element is to be mounted, firing at a relatively low temperature is possible, and accordingly the support can be produced by integrally firing such an insulating base plate and a lead frame, without oxidation or melting of the lead frame made of an electrically conductive metal. Accordingly, a support for mounting a light-emitting element which has heat resistance and excellent heat dissipation properties as well, can be obtained.

Figure 1:
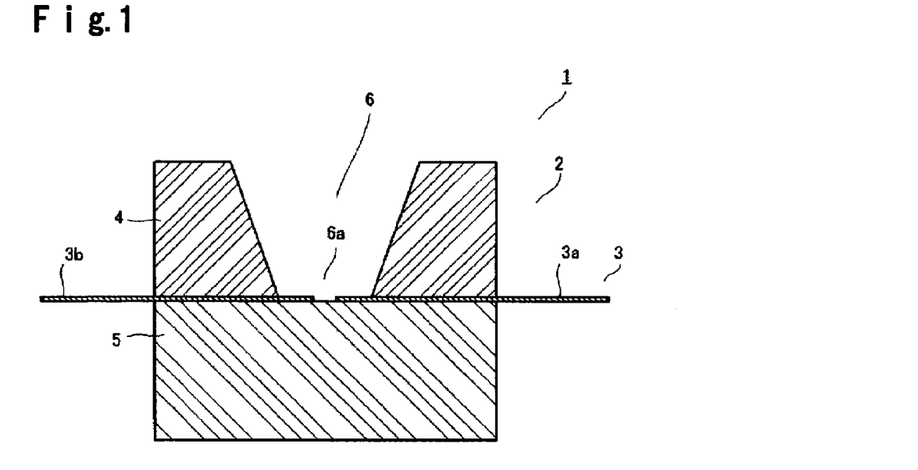
FIG. 1 is a cross sectional view illustrating one example of a support for mounting a light-emitting element of the present invention.

FIG. 1 is a cross sectional view illustrating one example of a support 1 for mounting a light-emitting element of the present invention.

The support 1 for mounting a light-emitting element comprises an insulating base plate 2 on which a light-emitting element is to be mounted, and a lead frame 3 having a substantial plate form, provided in the insulating base plate 2. The insulating base plate 2 is composed of a side portion 4 and a support portion 5, and the entire insulating base plate 2 is formed by a sintered product of a glass ceramic composition containing a low temperature melting glass powder and a ceramic filler.

The insulating base plate 2 has a concave 6 surrounded by the side portion 4. The bottom of the concave 6 is formed by a surface appearing in the inside of the concave 6 among the surface on the upper side in the drawing of the support portion 5, and this bottom forms a mounting portion 6a on which a light-emitting element is to be mounted.

The lead frame 3 is for packaging a light-emitting element, and is provided as integrated with the insulating base plate 2 penetrating between the side portion 4 and the support portion 5. The lead frame 3 comprises thin metal plates, and is disposed in such a state that two lead frames 3a and 3b face each other with a distance of about several mm as exposed at the mounting portion 6a.

The insulating base plate 2 on which a light-emitting element is to be mounted is produced by mixing a low temperature melting glass powder and a ceramic filler to prepare a glass ceramic composition, and firing it.

The low temperature melting glass powder to be the main component of the glass ceramic composition is one having a softening point (Ts) of at most 630° C.

If the softening point (Ts) of the low temperature melting glass powder exceeds 630° C., when the glass ceramic composition is fired as integrated with the lead frame 3, oxidation of the electrically conductive metal constituting the lead frame 3 tends to proceed, whereby the thermal conductivity of the lead frame 3 may remarkably be lowered, or deterioration by heat at the time of firing may occur.

The softening point (Ts) of the low temperature melting glass powder is preferably at most 610° C.

On the other hand, if the softening point (Ts) of the low temperature melting glass powder is less than 450° C., when a light-emitting element is packaged on the support 1 for mounting a light-emitting element by wire bonding or when a light-emitting device having a light-emitting element mounted on the support is soldered to e.g. lighting equipment, the insulating base plate 2 may be deteriorated by heat.

Accordingly, the softening point (Ts) of the low temperature melting glass powder is preferably at least 450° C.

Further, the low temperature melting glass powder is preferably one having a glass transition point (Tg) of at least 350° C. and at most 500° C. If the glass transition point (Tg) is less than 350° C., the insulating base plate 2 may be deteriorated when a light-emitting element is packaged. On the other hand, if the glass transition point (Tg) exceeds 500° C., when the glass ceramic composition is fired as integrated with the lead frame 3, the electrically conductive metal constituting the lead frame 3 tends to be oxidized, whereby the thermal conductivity of the lead frame 3 may remarkably be lowered, or deterioration by heat at the time of firing may occur.

Such a low temperature melting glass powder is preferably one comprising, for example, as represented by mol % as calculated as the following oxides, at least 40 mol % and at most 50 mol % of $SiO_2$, at least 38 mol % and at most 48 mol % of $B_2O_3$, at least 0 mol % and at most 5 mol % of $ZrO_2$ and at least 0 mol % and at most 10 mol % of ZnO, containing at least one selected from $K_2O$ and $Na_2O$, and comprising at least 2 mol % and at most 10 mol % of $K_2O$, $Na_2O$, or $K_2O$ and $Na_2O$.

$SiO_2$ is a component to form a glass framework. If the $SiO_2$ content is less than 40 mol %, stable glass will hardly be obtained, and chemical durability may also be decreased.

On the other hand, if the $SiO_2$ content exceeds 50 mol %, the softening point (Ts) or the glass transition point may excessively be high. The $SiO_2$ content is preferably at least 40.5 mol %, more preferably at least 42 mol %. Further, the $SiO_2$ content is preferably at most 48 mol %, more preferably at most 47 mol %.

$B_2O_3$ has an effect to lower the softening point (Ts). If the $B_2O_3$ content is less than 38 mol %, the softening point (Ts) or the glass transition point (Tg) may not sufficiently be lowered. On the other hand, if the $B_2O_3$ content exceeds 48 mol %, stable glass will hardly be obtained, and the chemical durability may also be decreased. The $B_2O_3$ content is preferably at least 39 mol %, more preferably at least 41 mol %. Further, the $B_2O_3$ content is preferably at most 45 mol %, more preferably at most 43 mol %.

$ZrO_2$ may be contained within a range of at most 5 mol % so as to increase the stability of glass. If the $ZrO_2$ content exceeds 5 mol %, the softening point (Ts) may be high. The $ZrO_2$ content is preferably at most 4 mol %.

ZnO may be added to lower the softening point (Ts). If the ZnO content exceeds 10 mol %, the strength of the insulating base plate 2 may be decreased. The ZnO content is preferably at most 9 mol %, more preferably less than 4 mol %. Further, the ZnO content is preferably at least 1 mol %.

$Na_2O$ or $K_2O$ is added to accelerate vitrification and to lower the softening point (Ts) and the glass transition point (Tg).

The total content of $Na_2O$ and $K_2O$ is preferably at least 2 mol % and at most 10 mol %. If the total content of $Na_2O$ and $K_2O$ is less than 2 mol %, the softening point (Ts) or the glass transition point (Tg) may be high, or glass tends to be unstable, whereby it is likely to undergo phase separation. On the other hand, if the total content of $Na_2O$ and $K_2O$ exceeds 10 mol %, acid resistance may be decreased, or the strength of the insulating base plate 2 may be decreased. The total content of $Na_2O$ and $K_2O$ is more preferably at least 6 mol % and at most 8 mol %.

The low temperature melting glass powder to be used for the glass ceramic composition is not necessarily limited to one comprising only the above components and may contain other components within a range to satisfy various properties such as the softening point (Ts) and the glass transition point (Tg). When it contains such other components, their total content is preferably at most 10 mol %.

$Al_2O_3$ may be added within a range not to exceed 5 mol % so as to increase the stability, the chemical durability and the strength of glass.

If the $Al_2O_3$ content exceeds 5 mol %, the softening point (Ts) or the glass transition point (Tg) may excessively be high. The $Al_2O_3$ content is preferably at most 3 mol %.

CaO may be added within a range not to exceed 5 mol % so as to increase the stability of glass and to lower the softening point (Ts) or the glass transition point (Tg). If the CaO content exceeds 5 mol %, glass may be unstable. The CaO content is preferably at most 3 mol %, more preferably at most 1 mol %.

MgO may be contained in a content of at most 5 mol % so as to stabilize glass. If its content exceeds 5 mol %, the softening point (Ts) may be high. The MgO content is preferably at most 3 mol %.

BaO may also be added so as to stabilize glass, but its content is preferably at most 1%.

The low temperature melting glass powder to be used for the glass ceramic composition is obtained by blending and mixing glass materials to achieve the above glass composition, producing glass by a melting method using the glass material mixture, and grinding the produced glass by a dry grinding method or a wet grinding method. In the case of a wet grinding method, it is preferred to employ water as a solvent. The grinding can be carried out by using a grinding machine such as a roll mill, a ball mill or jet mill.

The 50% particle size (D50) of the low temperature melting glass powder to be used for the insulating base plate 2 is preferably at least 0.5 μm and at most 4 μm. If the 50% particle size of the low temperature melting glass powder is less than 0.5 μm, the low temperature melting glass powder is likely to cohere, whereby the handling tends to be difficult, and pulverization may take too long. On the other hand, if the 50% particle size of the low temperature melting glass powder exceeds 4 μm, the temperature at which the glass powder is softened may be increased, or the sintering of the low temperature melting glass powder may be inadequate. The particle size can be adjusted, for example, by classification after the grinding as the case requires. In this specification, the 50% particle size (D50) is a value measured by a laser diffraction scattering type particle size distribution measuring apparatus.

Further, the maximum particle size of the low temperature melting glass powder is preferably at most 20 μm. If the maximum particle size exceeds 20 μm, the sintering properties of the low temperature melting glass powder tend to be decreased, and undissolved components may remain in the sintered product, whereby the reflectivity of the insulating base plate 2 may be decreased.

The maximum particle size of the low temperature melting glass powder is more preferably at most 10 μm.

On the other hand, as the ceramic filler, one used heretofore, having a melting point of at least 1,500° C., may be used without any particular restriction, and for example, an alumina powder, a zirconia powder, a titania powder or a mixture thereof is preferably employed. The 50% particle size (D50) of the ceramic filler is preferably, for example, at least 0.5 μm and at most 4 μm. In addition to the above, there is a white ceramic filler, but its use is preferably avoided since it may cause drawbacks on the support for mounting a light-emitting element. Such drawbacks may, for example, be a decrease in the light reflectance, a decrease in the strength, a decrease in the sintering property, and an increase in the difference in the thermal expansion coefficient with the lead frame due to a decrease in the thermal expansion coefficient.

Such low temperature melting glass powder and ceramic filler are blended and mixed, for example, so that the low temperature melting glass powder would be at least 60 vol % and at most 80 vol %, and the ceramic filler would be at least 20 vol % and at most 40 vol %, to obtain a glass ceramic composition.

If the content of the ceramic filler is less than 20 vol %, no sufficient reflectance of a sintered product of the glass ceramic composition may be obtained. On the other hand, if the content of the ceramic filler exceeds 40 vol %, the sintering property of the glass ceramic composition tends to be low, and the strength of the sintered product may be decreased.

As the lead frame 3, an electrically conductive metal plate having a thickness at a level of from 0.1 to 0.5 mm may be used. As the metal plate, one used heretofore may be used without any particular restriction, and for example, an electrically conductive metal such as aluminum, copper, an iron/copper alloy or an iron/nickel alloy is suitably used. Further, the lead frame 3 may have a plated layer formed by depositing e.g. nickel, gold, titanium or silver in a thickness of about several μm, on the surface of the above electrically conductive metal plate.

The support 1 for mounting a light-emitting element of the present invention is described with reference to one example. However, various changes and modifications are possible without departing from the intention and the scope of the present invention, and as the case requires.

Figure 2:
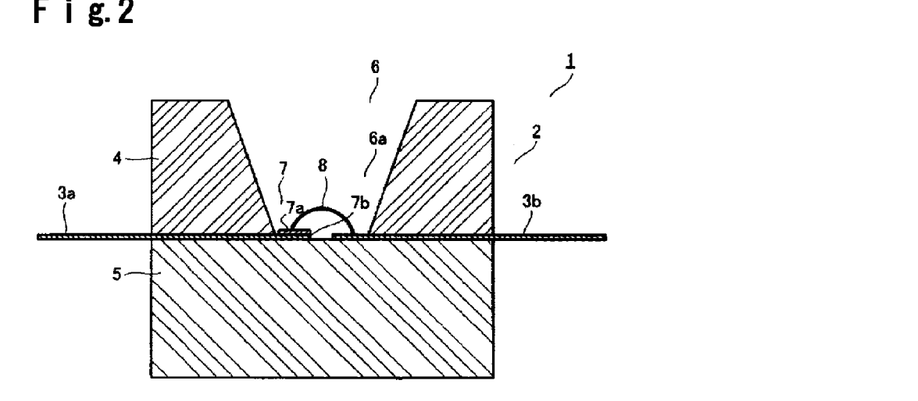
FIG. 2 is a cross sectional view illustrating a state where a light-emitting element is mounted on a support for mounting a light-emitting element of the present invention.

FIG. 2 is a cross sectional view illustrating a state where a light-emitting element 7 is mounted on a support 1 for mounting a light-emitting element of the present invention. As shown in FIG. 2, the light-emitting element 7 is fixed to the surface at the edge of the lead frame 3a exposed at the mounting portion 6a by means of an electrically conductive adhesive, the surface on the upper side in the drawing forms a light-emitting surface 7a, and an electrode (anode) is provided on a part of the light-emitting surface 7a. Further, the other electrode (cathode) is provided at the contact surface 7b (the lower side in the drawing) in contact with the lead frame 3a. The electrode (anode) on the light-emitting surface 7a side is connected to the lead frame 3b on the opposite side by a bonding wire 8. Thus, the electrode (anode) at the light-emitting surface 7a side is connected to the lead frame 3b, and the electrode (anode) on the contact surface 7b side is connected to the lead frame 3a.

Accordingly, heat generated from the light-emitting element 7 when applying current is transmitted through the lead frame 3a on which the light-emitting element 7 is mounted and is quickly dissipated to the outside of the light-emitting device 10, and in addition, it is transmitted through the bonding wire 8 and is dissipated to the outside of the light-emitting device 10 from the lead frame 3b as well.

The light-emitting device 10 of the present invention comprises, as described with reference to FIG. 2, the light-emitting element 7 such as a light-emitting diode mounted on the mounting surface 6a of the support 1 for mounting a light-emitting element. And, as shown in FIG. 3 for example, in the concave 6 of the support 1 for mounting a light-emitting element, a sealing material 9 is injected so as to cover the light-emitting element 7 and the bonding wire 8 to constitute the light-emitting device 10.

As the main component of the sealing material 9, for example, a silicone resin or an epoxy resin may be used, and particularly a silicone resin is preferred as it is excellent in the light resistance and the heat resistance.

By adding a phosphor, etc. to the resin component, the color of light obtained from the light-emitting device 10 can suitably be adjusted.

Figure 3:
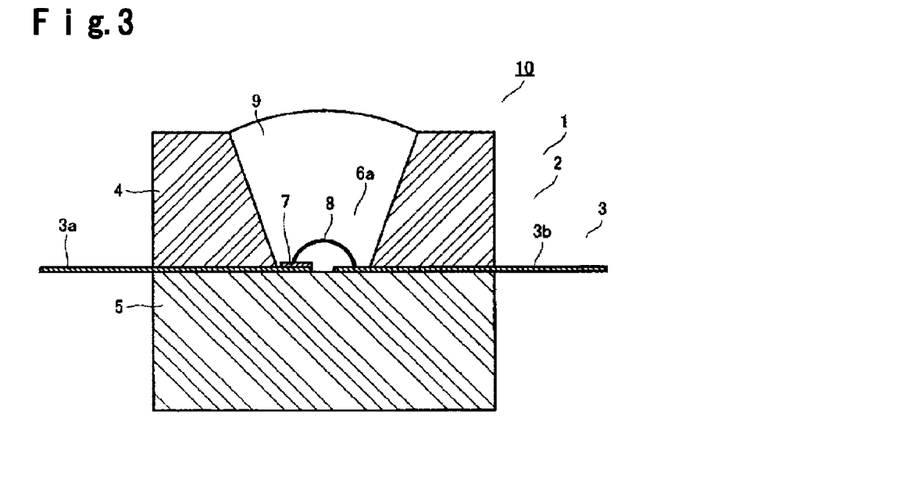
FIG. 3 is a cross sectional view illustrating one example of a light-emitting device of the present invention.

The light-emitting device of the present invention is not limited to one such that the sealing material 9 is injected into the concave 6 as shown in FIG. 3, and it may, for example, be one such that a lid-like member is provided at the opening of the concave 6 so that the concave 6 is hollow, or may simply be one such that the light-emitting element 7 is mounted on the support 1 for mounting a light-emitting element as shown in FIG. 2.

According to the light-emitting device of the present invention, by using the support 1 for mounting a light-emitting element having high heat resistance, even when the heat value from the light-emitting element 7 is large, the insulating base plate 2 portion on which the light-emitting element 7 is mounted will not substantially be damaged e.g. by burning or cracks by heat, and stable performance as the light-emitting device 10 can be maintained.

Further, as the lead frame 3 is provided as integrated with the insulating base plate 2 without being oxidized, heat generated from the light-emitting element 7 is quickly dissipated to the outside of the light-emitting device 10 through the lead frame 3. Accordingly, even with a light-emitting device having a high power light-emitting element 7 mounted, a decrease in the luminous efficiency by an excessive temperature increase can be suppressed, and light can be emitted with high brightness.

Such a light-emitting device 10 of the present invention is suitably used as backlights for e.g. liquid crystal displays, manual operation button light-emitting portion of small-sized information terminals, illumination for automobiles or for decoration, or other light sources.

The support 1 for mounting a light-emitting element of the present invention is produced as follows.

In the following description, members to be used for its production will be described with reference to the same symbols as those of member of a complete product.

FIGS. 4 to 9 are cross sectional views illustrating one example of a step for producing the support 1 for mounting a light-emitting element of the present invention.

The support 1 for mounting a light-emitting element is formed, as shown in FIGS. 4 to 9 for example, in such a manner that a non-fired side member 4A and a non-fired support member 5A are produced in molds 40 and 50, and they are overlaid with a lead frame 3 sandwiched therebetween to form a non-fired support 1 for mounting a light-emitting element, which is fired in a state where these members are held in the molds 40 and 50, and then cooled.

Figure 4:
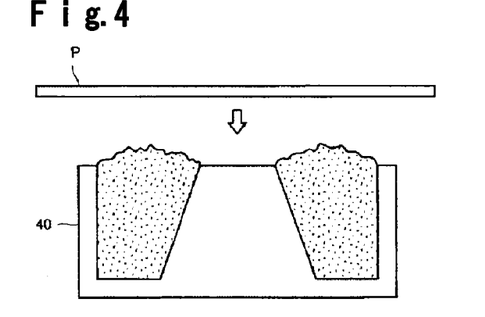
FIG. 4 is a cross sectional view illustrating one example of a step for producing a support for mounting a light-emitting element of the present invention.
Figure 5:
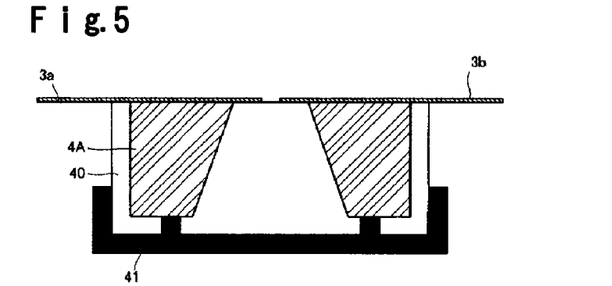
FIG. 5 is a cross sectional view illustrating one example of a step for producing a support for mounting a light-emitting element of the present invention.

First, the mold 40 to prepare the side portion 4 is filled with a powder comprising the glass ceramic composition as shown in FIG. 4. Then, the powder put in the mold 40 is compression molded by using a pressing machine to be packed by a pressing plate P. Then, as shown in FIG. 5, a frame 41 to separate and take out the side member 4 obtainable after firing the non-fired side member 4A from the mold 40 is fitted to the bottom of the mold 40. Then, an adhesive is applied to the upper surface of the non-fired side member 4A, and lead frames 3a and 3b are disposed thereon and fixed to the surface of the non-fired side member 4A.

Figure 6:
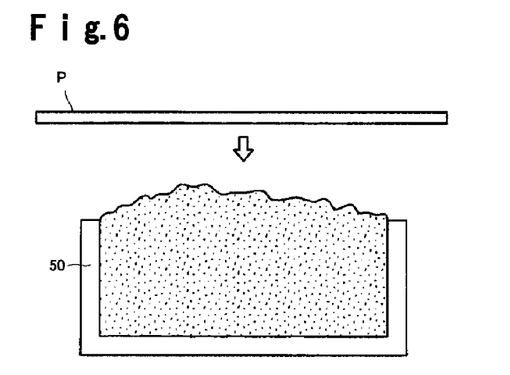
FIG. 6 is a cross sectional view illustrating one example of a step for producing a support for mounting a light-emitting element of the present invention.
Figure 7:
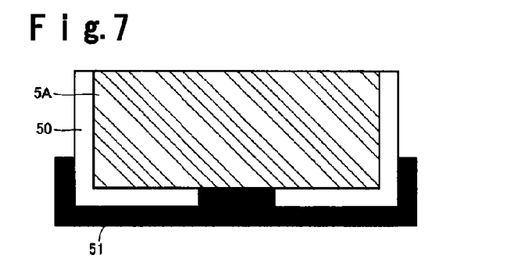
FIG. 7 is a cross sectional view illustrating one example of a step for producing a support for mounting a light-emitting element of the present invention.

Separately, as shown in FIG. 6, the mold 50 to prepare the support portion 5 is filled with a powder comprising the glass ceramic composition. Then, in the same manner as for the side portion 4, the powder put in the mold 50 is compression molded by using a pressing machine by a press plate P. Then, as shown in FIG. 7, a frame 51 to separate and take out the support member 5 obtainable after firing the non-fired support member 5A from the mold 50 is fitted to the bottom of the mold 50.

Figure 8:
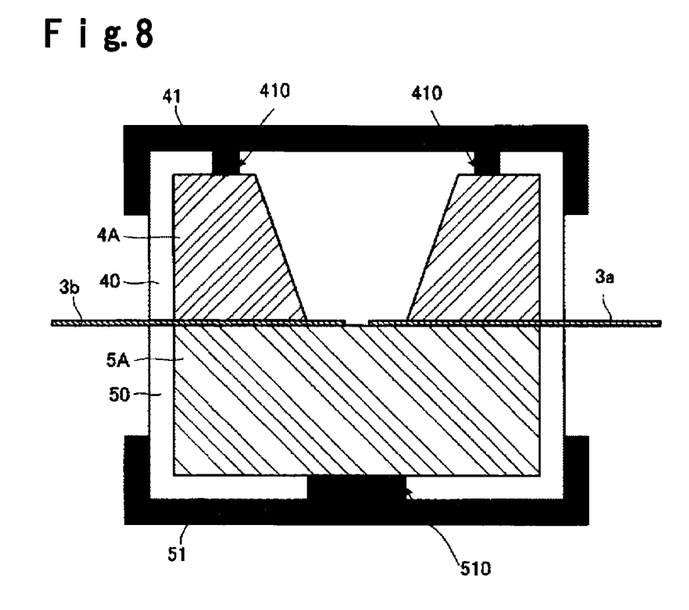
FIG. 8 is a cross sectional view illustrating one example of a step for producing a support for mounting a light-emitting element of the present invention.

Then, as shown in FIG. 8, an adhesive is applied to the surface of the non-fired support member 5A, and the non-fired side member 4A and the non-fired support member 5A are overlaid so that the lead frame-mounted surface of the non-fired side member 4A is in contact with the surface of the non-fired support member 5A, to form a non-fired support 1A for mounting a light-emitting element. Then, the non-fired support 1A for mounting a light-emitting element is fired in a state where it is held in molds, and then the molds are removed from the sintered product to obtain a support for mounting a light-emitting element.

Firing is carried out by holding the non-fired support at a temperature of at least 550° C. and at most 630° C. for at least 30 minutes and at most 60 minutes for example, particularly preferably at a temperature of at least 580° C. and at most 600° C.

If the firing temperature exceeds 630° C., the electrically conductive metal constituting the lead frame 3 tends to be oxidized, whereby the thermal conductivity of the lead frame 3 may be decreased or the electrical conductivity may be decreased. Further, in a case where the lead frame 3 contains aluminum as the main component, aluminum may be melted, whereby the lead frame 3 is deteriorated. On the other hand, if the firing temperature is less than 550° C., sintering will not sufficiently proceed, and a dense insulating base plate 2 may not be obtained.

Figure 9:
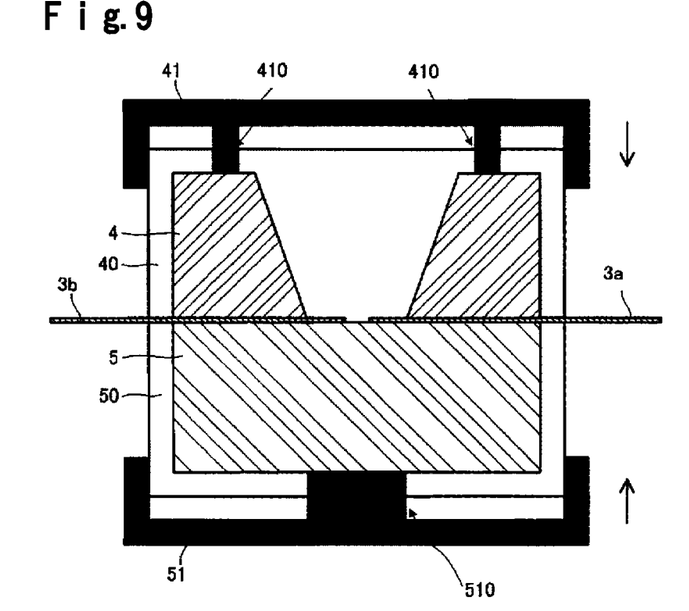
FIG. 9 is a cross sectional view illustrating one example of a step for producing a support for mounting a light-emitting element of the present invention.

After completion of firing, the sintered product is cooled for a certain time, and then as shown in FIG. 9, a pressure of 3 kPa is applied to the frame 41 in a direction toward the side portion 4, whereby the side portion 4 is pressed in a downward direction in the drawing at a contact surface with a protruded portion 410 of the frame 41, and is separated from the mold 40.

Further, also to the frame 51, a pressure of 3 kPa is applied in a direction toward the support portion 5, whereby the support portion 5 is pressed in an upward direction in the drawing at a contact area with a protruded portion 510 of the frame 51 and is separated from the mold 50.

In the above process for producing the support 1 for mounting a light-emitting element, the non-fired side member 4A and the non-fired support member 5A are fired in a state where they are held in the molds 40 and 50, and then the molds 40 and 50 are removed from the sintered product, but the production process is not necessarily limited to such a process. For example, the molds 40 and 50 may be separated from the non-fired side member 4A and the non-fired support member 5A, at a stage before firing, and then the non-fired support 1A for mounting a light-emitting element may be fired. Further, the order of formation of the respective members, etc. may also be properly changed so long as the support 1 for mounting a light-emitting element can be produced.

EXAMPLES

Now, the present invention will be described in further detail with reference to Examples.

Example 1

First, a low temperature melting glass powder was produced. That is, materials were blended and mixed to achieve a composition comprising, as represented by mol % as calculated as the following oxides, 45 mol % of $SiO_2$, 41.5 mol % of $B_2O_3$, 4 mol % of $ZrO_2$, 1.5 mol % of ZnO, 2 mol % of $Na_2O$ and 6 mol % of $K_2O$, this material mixture was put in a platinum crucible and melted at from 1,300 to 1,400° C. for 60 minutes, and glass in a molten state was cast and cooled. The obtained glass was ground by an alumina ball mill for from 20 to 60 hours to produce a low temperature melting glass powder. As a solvent at the time of grinding, ethyl alcohol was used.

The glass transition point (Tg) of the obtained low temperature melting glass powder was measured by using a thermal analyzer TG-DTA2000 manufactured by Macscience at a temperature-raising rate of 10° C./min up to 1,000° C., whereupon the glass transition point (Tg) was 443° C. Further, the softening point (Ts) was 602° C.

The 50% particle size (D50) of the low temperature melting glass powder thus obtained was measured by using a laser diffraction scattering type particle size distribution measuring apparatus, whereupon it was 2.8 μm.

65 Mass % of this low temperature melting glass powder and 35 mass % of an alumina filler (50% particle size (D50): 2.8 μm, manufactured by Showa Denko K.K., tradename: AL-47H) were blended and mixed to produce a glass ceramic composition.

A side portion mold 40 and a support portion mold 50 were filled with the above glass ceramic composition, and the powder was press-molded by a pressing machine (see FIGS. 4 and 6). Then, frames 41 and 51 were fitted to the bottoms of the respective molds, an adhesive was applied to the surface of a non-fired side member 4A in the side portion mold 40, and as shown in FIG. 5, lead frames 3a and 3b were disposed and fixed. The side portion mold 40 and the support portion mold 50 were overlaid as shown in FIG. 8, followed by firing. Firing was carried out at 590° C. for 40 minutes. Then, the sintered product in the side portion mold 40 and the support portion mold 50 was cooled for 120 minutes and then taken out from the molds 40 and 50 by the frames 41 and 51 (see FIG. 9), to obtain a support 1 for mounting a light-emitting element.

The lead frame 3 of the obtained support 1 for mounting a light-emitting element was not oxidized, and was applicable to a light-emitting device 10.

INDUSTRIAL APPLICABILITY

According to the present invention, by using a predetermined glass ceramic composition as an insulating base plate on which a light-emitting element is to be mounted, a support for mounting a light-emitting element having high heat resistance and having damage of the base plate and a decrease in hermetic by heat suppressed, can be obtained, and by employing such a support for mounting a light-emitting element, a light-emitting device of which damage of the base plate or a decrease in hermetic by heat can be suppressed, and from which heat generated from a light-emitting element can quickly be dissipate to the outside even when a high power light-emitting element is mounted.

REFERENCE SYMBOLS

1: Support for mounting light-emitting element, 2: insulating base plate, 3: lead frame, 4: side portion, 4A: non-fired side member, 5: support portion, 5A: non-fired support member, 6: concave, 6a: mounting portion, 7: light-emitting element, 8: bonding wire, 9: sealing material, 10: light-emitting device, 40, 50: mold, 41, 51: frame.

What is claimed is:

1. A support for mounting a light-emitting element, comprising: an insulating base plate having a mounting portion on which a light-emitting element is to be mounted, and a lead frame for packaging the light-emitting element to be mounted on the insulating base plate, integrally formed, wherein the insulating base plate is made of a sintered product of a glass ceramic composition comprising a glass powder and a ceramic filler, and a softening point (Ts) of the glass powder is at most 630° C.

2. The support for mounting a light-emitting element according to claim 1, wherein the ceramic filler is at least one selected from the group consisting of an alumina powder, a zirconia powder, and a titania powder.

3. The support for mounting a light-emitting element according to claim 1, wherein the lead frame is made of an electrically conductive metal or alloy selected from the group consisting of aluminum, copper, an iron/copper alloy, and an iron/nickel alloy.

4. The support for mounting a light-emitting element according to claim 1, wherein in the glass ceramic composition, a content ratio of the glass powder is at least 60 vol % and at most 80 vol %, and the content ratio of the ceramic filler is at least 20 vol % and at most 40 vol %.

5. The support for mounting a light-emitting element according to claim 1, wherein the insulating base plate is concave in a bowl shape, and the lead frame penetrates through the insulating base plate and is exposed to the bottom of the mounting portion.

6. The support for mounting a light-emitting element according to claim 1, wherein the softening point (Ts) of the glass powder is at least 450° C. and at most 630° C.

7. The support for mounting a light-emitting element according to claim 1, wherein a 50% particle size (D50) of the glass powder is at least 0.5 μm and at most 4 μm.

8. A light-emitting device, comprising the insulating base support for mounting a light-emitting element as defined in claim 1, and a light-emitting element mounted on the mounting portion of the insulating base support for mounting a light-emitting element.

* * * * *